(12) United States Patent
Lim et al.

(10) Patent No.: US 6,182,265 B1
(45) Date of Patent: Jan. 30, 2001

(54) METHOD FOR ENCODING A CHANNEL USING A PARALLEL CONVOLUTIONAL ENCODER

(75) Inventors: In Gi Lim; Kyung Jin Byun; Ki Cheon Han; Kwang Il Yeon; Kyung Soo Kim, all of Daejeon (KR)

(73) Assignee: Electronics and Telecommunication Research Institute, Daejeon (KR)

( * ) Notice: Under 35 U.S.C. 154(b), the term of this patent shall be extended for 0 days.

(21) Appl. No.: 09/136,182

(22) Filed: Aug. 19, 1998

(30) Foreign Application Priority Data

Oct. 24, 1997 (KR) .................................................. 97-54788

(51) Int. Cl.[7] ................................................. H03M 13/03
(52) U.S. Cl. ............................................................ 714/786
(58) Field of Search ................................... 714/786, 787, 714/788, 789, 742, 752, 755

(56) References Cited

U.S. PATENT DOCUMENTS

| | | | |
|---|---|---|---|
| 4,641,327 | * 2/1987 | Wei ....................................... | 375/114 |
| 5,042,033 | 8/1991 | Costa .................................... | 714/701 |
| 5,103,459 | 4/1992 | Gilhousen et al. ...................... | 375/1 |
| 5,537,420 | * 7/1996 | Huang ................................... | 714/701 |
| 5,721,745 | * 2/1998 | Hladik et al. ......................... | 714/755 |
| 5,912,898 | * 6/1999 | Khoury ................................. | 714/701 |
| 5,996,104 | * 11/1999 | Herzberg .............................. | 714/755 |
| 6,000,054 | * 12/1999 | Bahr et al. ............................ | 714/786 |
| 6,023,783 | * 2/2000 | Divsalar et al. ...................... | 714/792 |
| 6,038,695 | * 3/2000 | Pehkonen ............................. | 714/786 |

* cited by examiner

Primary Examiner—Albert De Cady
Assistant Examiner—Shelly A Chase
(74) Attorney, Agent, or Firm—Antonelli, Terry, Stout & Kraus, LLP

(57) ABSTRACT

A method for encoding a channel using a parallel convolutional encoder is disclosed. The method includes the steps of a first step for performing an encoding operation using a parallel convolutional encoder at the time when a data is inputted into a frame input data register for implementing a channel encoding operation and generating a code symbol, and a second step for storing the thusly generated code symbol into an interleaver RAM which is alternately selected by the frame unit.

8 Claims, 5 Drawing Sheets

CONVENTIONAL ART

METHOD FOR ENCODING A CHANNEL USING A PARALLEL CONVOLUTIONAL ENCODER

BACKGROUND OF THE INVENTION

1. Field of the Invention

The present invention relates to a method for encoding a channel using a parallel convolutional encoder, and in particular, to an improved method for encoding a channel using a parallel convolutional encoder which is capable of enhancing the performance of a digital wireless communication using a convolutional encoding and interleaving operation.

2. Description of the Conventional Art

FIG. 1 illustrates a conventional channel encoder in which one frame data inputted through a frame input data register 1 in accordance with a control of a micro controller is sequentially inputted an encoder RAM (ERAM) 4 in accordance with a control of a write address controller 2.

The data stored in the ERAM 4 is sequentially read earlier than the time when the data is computed at a boundary of the next frame and are inputted into a convolutional encoder 6 through a parallel-serial converter 5 for thereby generating a code symbol, and the code symbol generated for performing an interleaving operation is stored into an interleaver RAM (IRAM) 7 in accordance with a control of a write address controller 8 for thereby reading the data in a form of row at a normalized time in accordance with a control of a read address controller 9 at a boundary of the frame for thereby completing a channel encoding operation.

FIG. 2 illustrates a timing of a conventional channel encoder. As shown therein, in Step S1, the micro controller writes input data into a frame input data register 1 in accordance with a data request interrupt signal.

In Step S2, the input data stored in the frame input data register 1 is sequentially stored into the ERAM 4.

When the data of one frame is all inputted, the convolutional encoding operation becomes a ready state and waits an ERAM reading timing.

The input data of one frame is buffered into the ERAM 4 and then are read for thereby implementing a convolutional encoding operation. The above-described operation is simply performed but there is a problem in that the data should be written into the IRAM 7 within one frame's time, and one frame should be equally divided to thereby read the data stored in the IRAM 7 at a normalized time.

In order to control the above-described timing, the data should be written into the IRAM 7 between the final IRAM read time of the previous frame and the initial IRAM read time of the current frame, and only the data used at the time when the data is read from the IRAM 7 in a form of row at the above-described time are written into the IRAM, so that the IRAM write and read operations are performed at the same time.

There is a limit in that the micro controller stores frame input data into the frame input data register 1 by avoiding the time when the data are read from the ERAM 4 and then encoded. In addition, additional control operation is required for adjusting the position of a data request interrupt.

In Steps S3 and S4, the data stored in the ERAM 4 is sequentially read at the boundary of the frame for a predetermined time, and the convolutional encoding operation is performed with respect to the first frame.

In Step S5, the code symbol from the convolutional encoder is sequentially stored into the IRAM 7 from the first address.

As shown in FIG. 2, the operations for writing and reading the data into/from the IRAM are performed. Therefore, the data read at the initial time in a form of row is stored and written into the IRAM 7.

The data read from the IRAM 7 at the time which is obtained by equally dividing one frame at the boundary of the frame in Step S6 for thereby implementing a channel encoding operation of the initial frame, and then the input data of the second frame is received in Step S7, and the channel encoding operation of the second frame is performed in the same manner as the first frame.

Namely, in order to implement the channel encoder which used a convolutional encoding operation and an interleaving operation, the ERAM 4 and the control circuit are required for buffering the frame input data. In addition, complicated timing control circuits are required for generating an address for performing a write and read operation within one frame time.

In addition, it is impossible to write the frame input data into the frame input data register 1 while the convolutional encoding operation is performed and the data stored in the ERAM 4 is read by the micro controller. In addition, in order to overcome the above problem, the position of the data request interrupt should be adjusted for thereby additionally requiring a control operation.

SUMMARY OF THE INVENTION

Accordingly, it is an object of the present invention to provide a method for encoding a channel using a parallel convolutional encoder which overcomes the aforementioned problems encountered in the conventional art.

It is another object of the present invention to provide a method for encoding a channel using a parallel convolutional encoder which is capable of inputting data into a frame input data register and, at the same time, encoding the data using a parallel convolutional encoder and processing an interleaving operation using two interleaver RAMs without using a frame input data buffer RAM for decreasing the number of RAM control logic hardware of a channel encoder and implementing a simple protocol when changing a micro controller and a frame input data packet by overcoming the problems encountered in the conventional art which uses a RAM storing a frame data and another RAM interleaving a code symbol which is an output from the convolutional encoder when implementing a channel encoder using a convolutional encoding and interleaving operation.

In order to achieve the above objects, there is provided a method for encoding a channel using a parallel convolutional encoder according to a first embodiment of the present invention which includes the steps of performing an encoding operation using a parallel convolutional encoder at the time when data is inputted into a frame input data register for implementing a channel encoding operation and generating a code symbol, and storing the generated code symbol into an interleaver RAM which is alternately selected by the frame unit.

In order to achieve the above objects, there is provided a method for encoding a channel using a parallel convolutional encoder according to a second embodiment of the present invention which includes the steps of inputting frame input data into a frame input data register in accordance with a control of a micro controller for a channel encoding operation without using an input data buffer RAM, generating a code symbol by performing an encoding operation of the frame input data using a parallel convolutional encoder, sequentially storing the code symbol into an interleaver RAM which is alternately selected by the frame unit, and reading the data stored in the interleaver RAM and performing an interleaving operation based on the interleaver algorithm for the next frame.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

In the present invention, one frame is assumed to 20 msec, a constraint length (hereinafter called "K") of a convolutional encoder to 9, an encoding rate (R) to ½, a creative polynomial expression to $g0=753_8$ and $g1=561_8$, a frame input register to store data which is processed by 8 bits, namely 7 bits (MSB) and data which is processed by 0 bit (LSB).

In addition, the number of input data of one frame is assumed to 288 bits, and IRAM0 and IRAM1 need 72×8 bits when 8 bits are used.

Figure 1:
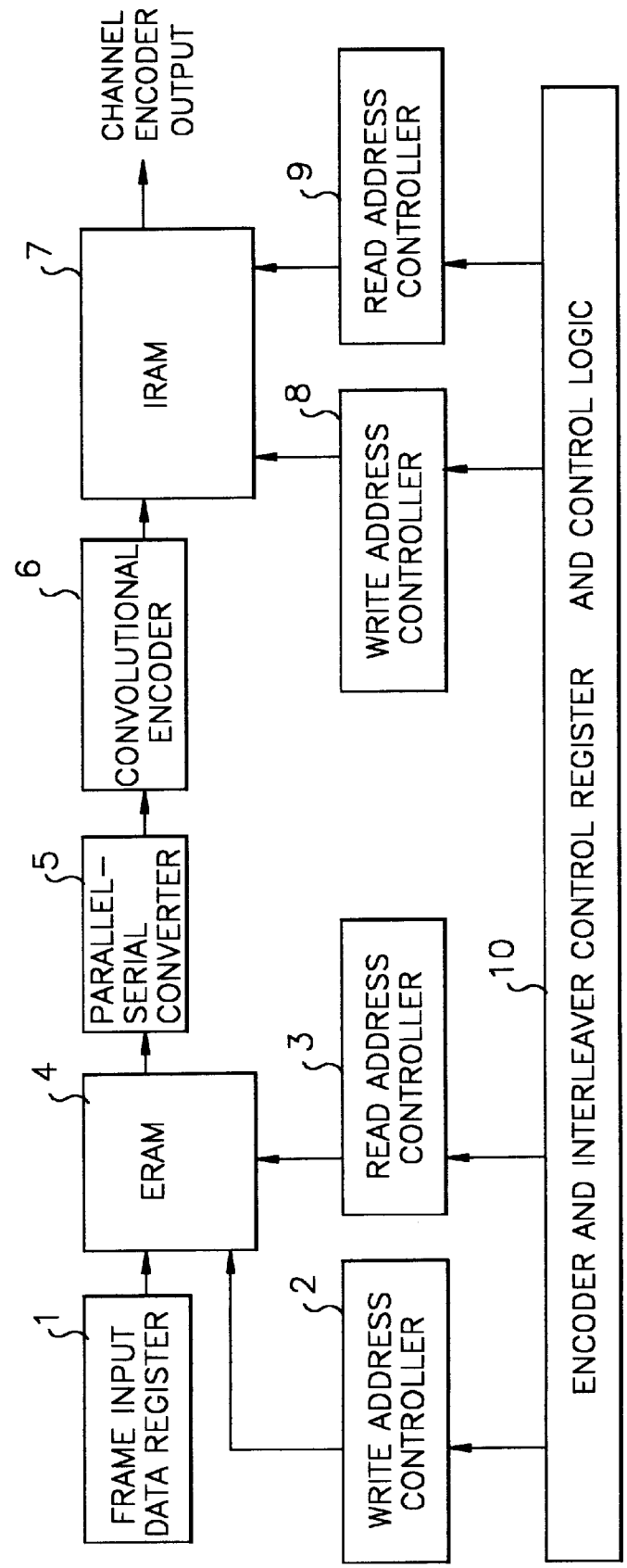
FIG. 1 is a block diagram illustrating a conventional channel encoder.
Figure 2:
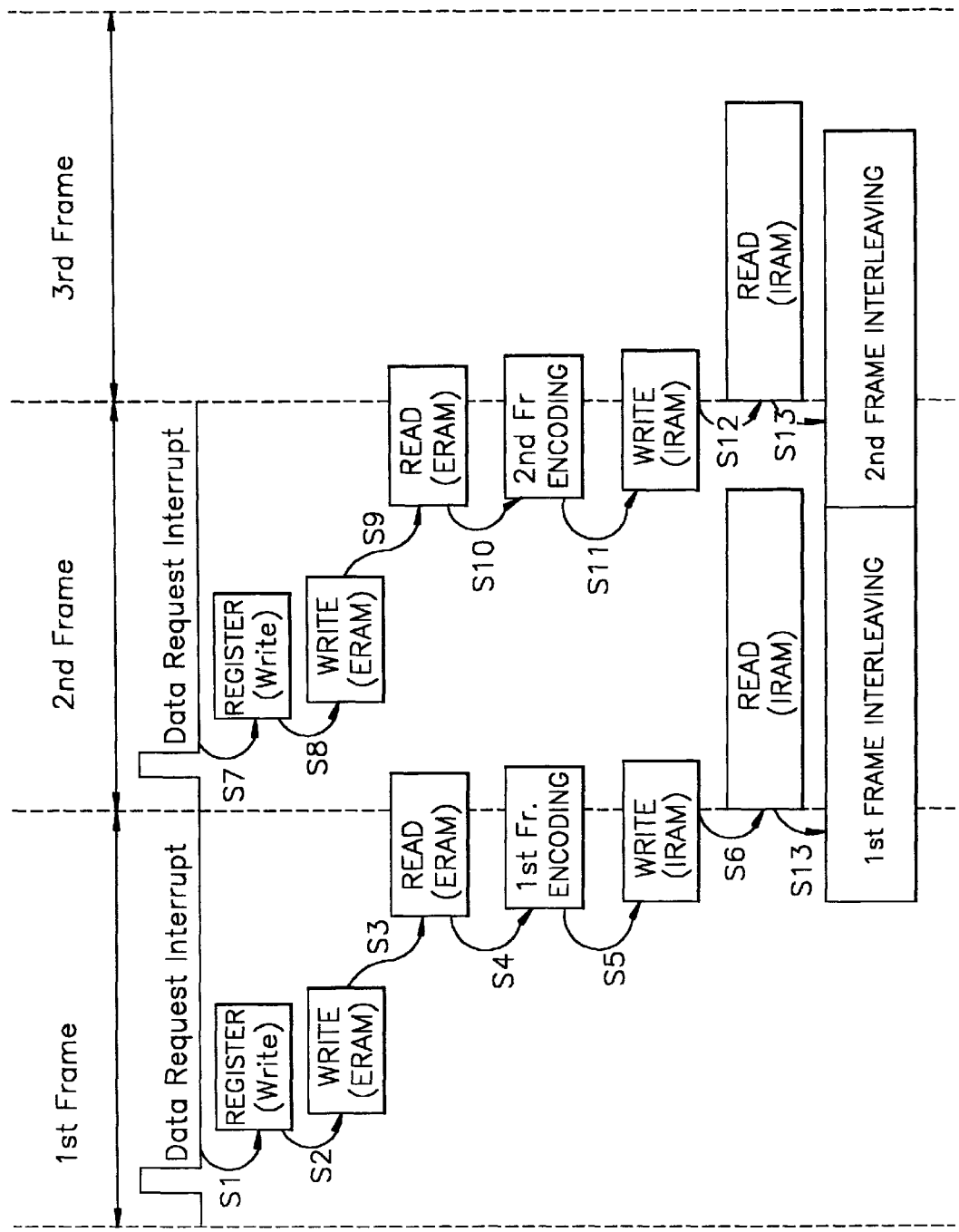
FIG. 2 is a view illustrating a timing of a conventional channel encoder.
Figure 3:
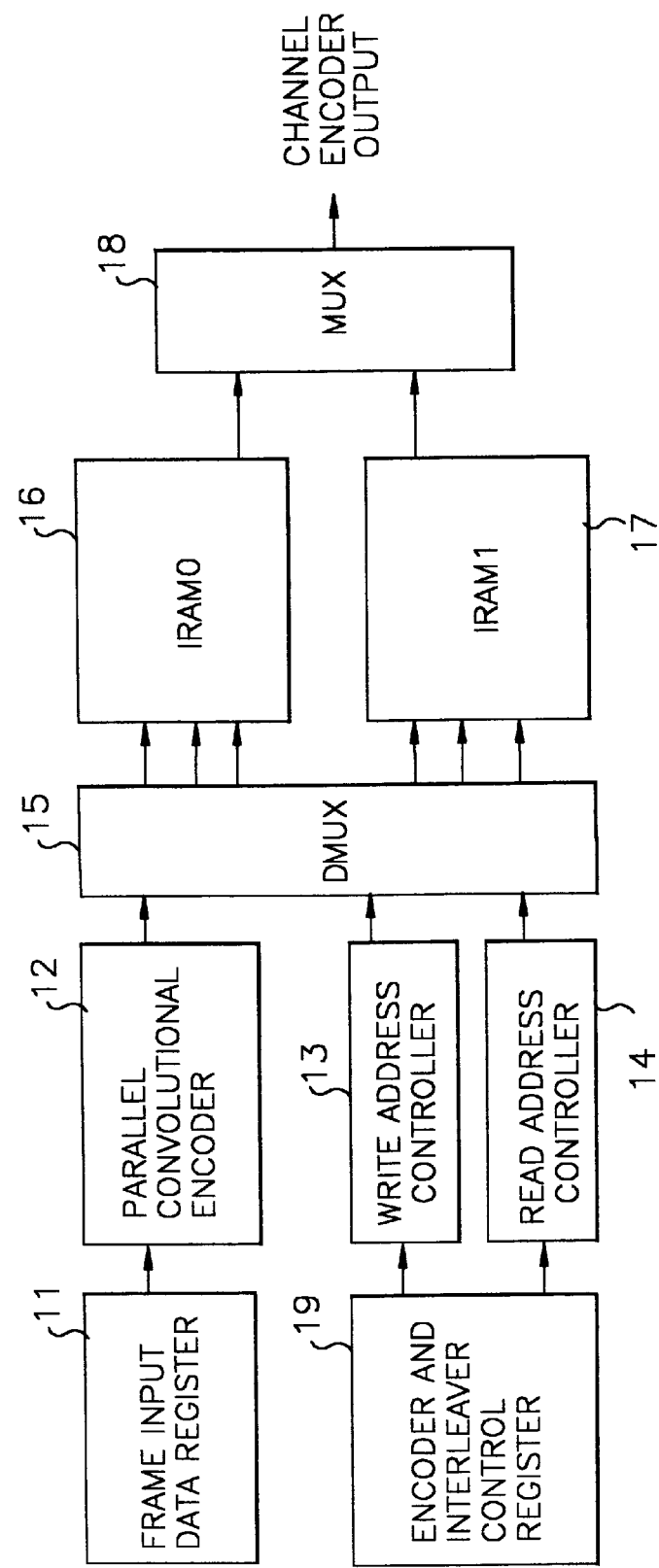
FIG. 3 is a block diagram illustrating a channel encoder according to the present invention.
Figure 4:
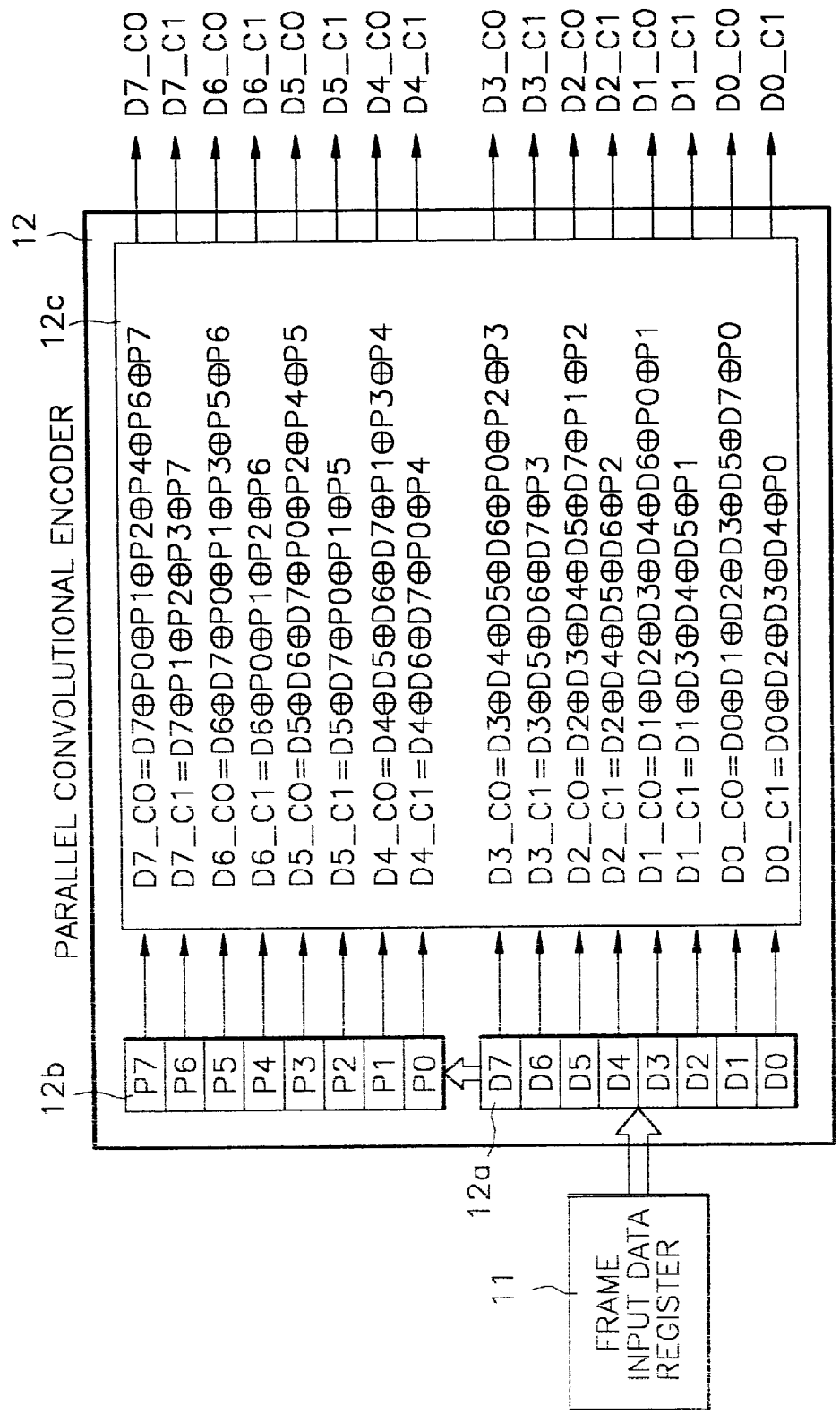
FIG. 4 is a view illustrating a parallel convolutional encoder according to the present invention.
Figure 5:
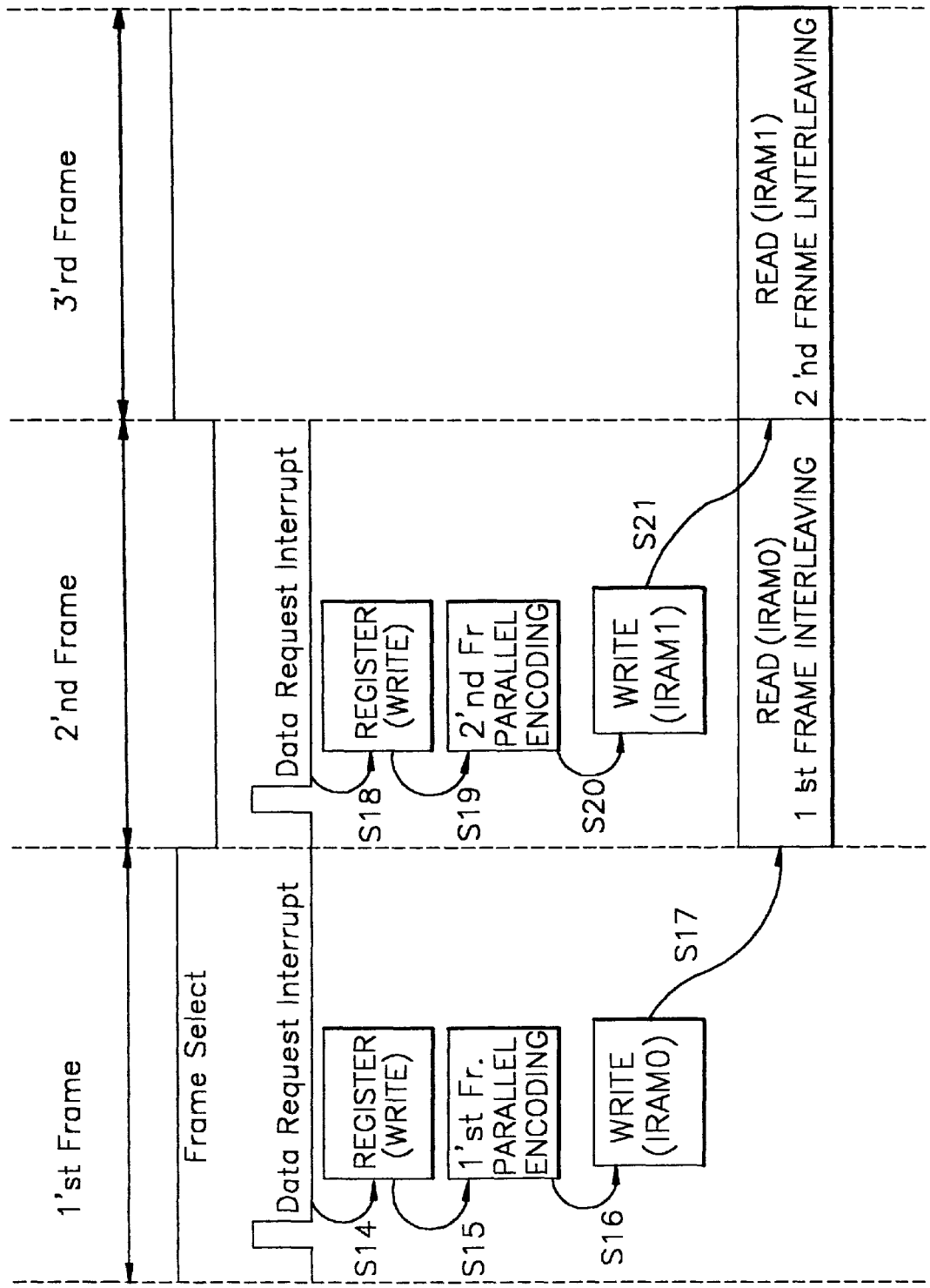
FIG. 5 is a view illustrating a timing of a channel encoder according to the present invention.

As shown in FIGS. 3, 4 and 5, in Step S14, in order to implement the channel encoding operation, the frame input data is inputted 36 times through the 8 bits from the frame input data register 11 during the first frame in accordance with a control of the micro controller.

At this time, the output 8 bits from the frame input data register 1 is inputted into the parallel convolutional encoder 12.

The first inputted 8 bit data is stored into the 8 bit register 12a of D7 through D0 of the parallel convolutional encoder 12. At this time, the 8 bit register 12b of P7 through P0 has an initial state of "0".

D7 among the 8 bits of D7 through D0 is an initially inputted data, and D0 is data which is last processed. 16 code symbols of D7_C0, D7_C1, D6_C0, D6_C1, . . . , D0_C0, D0_C1 are concurrently generated by the XOR block 12C as shown in FIG. 4.

16 code symbols which are generated from the parallel convolutional encoder 12 are divided into 8 bits of D7_C0, D7_C1, . . . , D4_C0, D4_C1 and 8 bits of D3_C0, D3_C0, . . . , D0_C0, D0_C1, and the 8 bits are stored into 0th address and first address of the interleaver RAM0 (IRAM0) through the demultiplexer (hereinafter called DEMUX) which is selected by the frame unit in accordance with a control of the write address controller 13.

The second 8 bit data is stored into the 8 bit register 12a of D7 through D0 of the parallel convolutional encoder 12. At this time, the data stored in D7 through D0 is shifted to the 8 bit register 12b of P7 through P0 for thereby generating 16 code symbols, and the thusly generated code symbols are stored into the second and third addresses of the IRAM0, respectively.

When one frame input data is performed 36 times, IRAM0 from 0th address to 71st address are sequentially written, so that the writing operation (S16) of the IRAM0 is performed for the first parallel convolutional encoding operation (S15) and the interleaving operation.

The IRAM0 16 is addressed via the demultiplexer (hereinafter called DEMUX) 15 which is selected by the frame unit in accordance with a controller of the read address control 14 at an equal time interval of one frame based on the interleaving algorithm at the boundary of the second frame, and one among 8 bit data read by the IRAM0 is selected, and the RAM reading operation is continuously performed in accordance with a control of the multiplexer 18 containing the 2×1 multiplexer selected by the frame unit thereby completing an interleaving operation of the first frame in Step S17.

The input data of the second frame is inputted through the frame input data register 11 while the reading operation of the IRAM0 16 is performed for an interleaving operation of the first frame in Step S18 and is inputted into the parallel convolutional encoder 12 and is sequentially stored into the IRAM1 17.

The IRAM1 17 is addressed via the DEMUX 15 which is selected by the frame unit in accordance with a control of the read address controller 14 at an equal dividing time interval of one frame based on the interleaving algorithm at the boundary of the third frame, and one among 8 bit data read from the IRAM1 is selected, and then the interleaving RAM reading operation is continuously performed in accordance with a control of the multiplexer 18 containing a 2×1 multiplexer selected by the frame unit, so that the interleaving operation of the second frame is completed in Step S21, and the channel encoding operation is completed using the parallel convolutional encoder.

As shown in FIG. 4, the XOR block 12c is implemented assuming that a constrain length (K) of a convolutional encoder 12 is 9, an encoding rate (R) is ½, and a creative polynomial is $g0=753_8$ and $g1=561_8$ for thereby obtaining the following 16 polynomials.

$D7\_C0=D7\oplus P0\oplus P1\oplus P2\oplus P4\oplus P6\oplus P7$ $D7\_C1=D7\oplus P1\oplus P2\oplus P3\oplus P7$ $D6\_C0=D6\oplus D7\oplus P0\oplus P1\oplus P3\oplus P5\oplus P6$ $D6\_C1=D6\oplus P0\oplus P1\oplus P2\oplus P6$ $D5\_C0=D5\oplus D6\oplus D7\oplus P0\oplus P2\oplus P4\oplus P5$ $D5\_C1=D5\oplus D7\oplus P0\oplus P1\oplus P5$ $D4\_C0=D4\oplus D5\oplus D6\oplus D7\oplus P3\oplus P4$ $D4\_C1=D4\oplus D6\oplus D7\oplus P0\oplus P4$ $D3\_C0=D3\oplus D4\oplus D5\oplus D6\oplus P0\oplus P2\oplus P3$ $D3\_C1=D3\oplus D5\oplus D6\oplus D7\oplus P3$ $D2\_C0=D2\oplus D3\oplus D4\oplus D5\oplus D7\oplus P1\oplus P2$ $D2\_C1=D2\oplus D4\oplus D5\oplus D6\oplus P2$ $D1\_C0=D1\oplus D2\oplus D3\oplus D4\oplus D6\oplus P0\oplus P1$ $D1\_C1=D1\oplus D3\oplus D4\oplus D5\oplus P1$ $D0\_C0 = D0 \oplus D1 \oplus D2 \oplus D3 \oplus D5 \oplus D7 \oplus P0$
$D0\_C1 = D0 \oplus D2 \oplus D3 \oplus D4 \oplus P0$ As described above, in the present invention, it is possible to overcome the problems that the micro controller can not store the input data into the frame input data register while the data stored in the ERAM is read and the convolutional encoding operation is performed, by encoding the data input using the parallel convolutional encoding unit and performing an interleaving operation using two IRAMs alternately selected by the frame unit. In addition, in the present invention, additional control is not used for adjusting the position of the data request interrupt.

Therefore, it is possible for the micro controller to access the frame input data register with enough time.

In addition, the present invention is directed to a method for encoding a channel using a convolutional encoding and interleaving technique for enhancing the performance of a digital communication. In the present invention, an encoder input buffer RAM (ERAM) is not used for storing the frame data inputted differently from the conventional art which uses a RAM for storing the frame input data inputted for the channel encoding operation and an interleaver RAM for interleaving the code symbol which is an output signal from the convolutional encoder. In the present invention, when the data is inputted into the frame input data register, the inputted data is encoded using the parallel convolutional encoder and the interleaving operation is performed with respect to the data using two interleaver RAMs alternately. The problems that the micro controller can not store the input data into the frame input data register while the data stored in the ERAM are read and the convolutional encoding operation is performed are overcome in the present invention. Therefore, it is not needed to additionally control the operation that the position of the data request interrupt is adjusted. The micro controller can access the frame input data register with a predetermined margin and enough time.

In addition, in the present invention, the ERAM write address controller and the read address controller are not used since the ERAM is not used. Namely, two IRAMs commonly use the IRAM write address controller and read address controller, so that the RAM is not additionally used.

Furthermore, it is easier to design the control logic circuit because the timing is easily controlled.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for encoding a channel using a parallel convolutional encoder in which convolutional encoding and interleaving techniques are used to enhance performance of a digital communication, comprising the steps of:
   (a) performing an encoding operation using a parallel convolutional encoder at the time when data is inputted into a frame input data register for implementing a channel encoding operation and generating code symbols; and
   (b) storing the code symbols generated into an interleaver random-access-memory RAM which is alternately selected by a frame unit.

2. The method of claim 1, wherein said step (a) includes the steps of:
   (a-1) receiving frame input data via said frame input data register during a first frame in accordance with a control signal of a micro controller;
   (b-1) inputting data from said frame input data register into said parallel convolutional encoder at the same time when step (a-1) is performed; and
   (c-1) generating data of a predetermined bit and a predetermined number of code symbols.

3. The method of claim 1, wherein said step (b) includes the steps of:
   (b-1) completing an interleaver RAM write operation of a first frame by repeatedly performing, with respect to the frame input data, an operation that a predetermined number of code symbols generated from said parallel convolutional encoder is sequentially stored into said interleaver RAM via a demultiplexer which is selected by the frame unit;
   (b-2) continuously reading the code symbols stored in a first interleaver RAM based on an interleaving algorithm at a boundary of a second frame and completing an interleaving operation for the first frame;
   (b-3) inputting data of the second frame into said parallel convolutional encoder while the reading operation of the first interleaver RAM of the first frame is performed, encoding the data and sequentially storing the data into a second interleaver RAM; and
   (b-4) reading the code symbols stored in the second interleaver RAM at a boundary of a third frame and performing an interleaving operation of the second frame.

4. A method for encoding a channel using a parallel convolutional encoder in which convolutional encoding and interleaving techniques are used to enhance performance of a digital communication, comprising the steps of:
   (a) inputting frame input data into a frame input data register for a channel encoding operation without using an input data buffer RAM;
   (b) generating code symbols by performing an encoding operation of the frame input data using a parallel convolutional encoder, the frame input data being shifted by using two 8-bit registers of the parallel convolutional encoder to generate 16 code symbols;
   (c) sequentially storing the code symbols into an interleaver RAM which is alternately selected by a frame unit;
   (d) reading data stored in the interleaver RAM and performing an interleaving operation based on an interleaver algorithm for the next frame;
   (e) writing an interleaver RAM of a first frame based on frame input data by repeatedly performing an operation that code symbols generated from said parallel convolutional encoder are sequentially stored into a first interleaver RAM through a demultiplexer which is selected by the frame unit;
   (f) completing an interleaving operation of a first frame by reading the code symbols stored in the first interleaver RAM based on an interleaving algorithm at a boundary of a second frame;
   (g) inputting data of the second frame into the parallel convolutional encoder and then encoding the same while the data stored in the first interleaver RAM of the first frame is read for sequential storage in the first interleaver RAM; and
   (h) reading the code symbols stored in the second interleaver RAM at a boundary of a third frame and performing an interleaving operation of the second frame.

5. A channel encoder, comprising:
   a data source which provides input frame data;

a parallel convolutional encoder coupled to receive input frame data from said data source, which performs parallel convolutional encoding operations of successive input frame data from said data source to produce code symbols;

first and second interleaver memory devices, which alternately stores said code symbols; and a de-multiplexer which controls storage of said code symbols from said parallel convolutional encoder into alternate first and second interleaver memory devices.

6. The channel encoder of claim 5, wherein said parallel convolutional encoder comprises:

a first 8-bit register which registers a first 8 bits of input frame data;

a second 8-bit register which registers a second 8 bits of input frame data; and a XOR logic unit which logically combines multiple bits from said first and second 8-bit registers to produce 16 code symbols.

7. The channel encoder of claim 6, wherein said de-multiplexer also controls alternate writing of said code symbols into one of said first and second interleaver memory devices and reading therefrom said code symbols in accordance with a write address signal or a read address signal.

8. The channel encoder of claim 6, wherein said first and second interleaver memory devices correspond to interleaver random-access-memory (RAM) devices.

\* \* \* \* \*